(12) United States Patent
Yamamoto et al.

(10) Patent No.: US 12,326,487 B2
(45) Date of Patent: Jun. 10, 2025

(54) MAGNETO-IMPEDANCE SENSOR ELEMENT

(71) Applicant: AICHI STEEL CORPORATION, Tokai (JP)

(72) Inventors: Michiharu Yamamoto, Aichi (JP); Ryusuke Yamashita, Aichi (JP); Shiori Itabuchi, Aichi (JP); Shunichi Tatematsu, Aichi (JP)

(73) Assignee: AICHI STEEL CORPORATION, Tokai (JP)

( * ) Notice: Subject to any disclaimer, the term of this patent is extended or adjusted under 35 U.S.C. 154(b) by 155 days.

(21) Appl. No.: 18/044,136

(22) PCT Filed: Sep. 10, 2021

(86) PCT No.: PCT/JP2021/033344
§ 371 (c)(1),
(2) Date: Mar. 6, 2023

(87) PCT Pub. No.: WO2022/070842
PCT Pub. Date: Apr. 7, 2022

(65) Prior Publication Data
US 2023/0333177 A1    Oct. 19, 2023

(30) Foreign Application Priority Data
Sep. 30, 2020   (JP) ................. 2020-165692

(51) Int. Cl.
*G01R 33/02*   (2006.01)
*G01R 33/06*   (2006.01)
*H10N 50/20*   (2023.01)

(52) U.S. Cl.
CPC ......... *G01R 33/063* (2013.01); *H10N 50/20* (2023.02)

(58) Field of Classification Search
CPC .................................................. G01R 33/063
See application file for complete search history.

(56) References Cited

U.S. PATENT DOCUMENTS

| 5,889,403 A | 3/1999 | Kawase |
| 6,351,119 B1 | 2/2002 | Kawase |

(Continued)

FOREIGN PATENT DOCUMENTS

| CN | 101738587 A | 6/2010 |
| JP | 2000-284030 A | 10/2000 |

(Continued)

OTHER PUBLICATIONS

Supplementary European Search Report issued Dec. 11, 2023 in European Application No. 21875144.4, 8 pgs.

(Continued)

*Primary Examiner* — Alesa Allgood
(74) *Attorney, Agent, or Firm* — Oblon, McClelland, Maier & Neustadt, L.L.P.

(57) ABSTRACT

A magneto-impedance sensor element includes a magneto-sensitive body having electromagnetic properties that vary by a magnetic field externally acting thereon; and a detection coil wound around the magneto-sensitive body, in which a voltage corresponding to the intensity of the magnetic field acting on the magneto-sensitive body is output from the detection coil by applying a pulse current or a high-frequency current to the magneto-sensitive body. The magneto-sensitive body includes a first magneto-sensitive section and a second magneto-sensitive section that are configured to carry a pulse current or a high-frequency current in opposite directions to each other.

12 Claims, 13 Drawing Sheets

(56) References Cited

U.S. PATENT DOCUMENTS

| | | |
|---|---|---|
| 6,472,868 B1 | 10/2002 | Takayama et al. |
| 8,378,670 B1 | 2/2013 | Honkura et al. |
| 8,587,300 B2 | 11/2013 | Honkura et al. |
| 9,857,436 B2 | 1/2018 | Honkura |
| 11,156,676 B2 | 10/2021 | Honkura et al. |
| 2003/0006763 A1 | 1/2003 | Takayama et al. |
| 2005/0146326 A1 | 7/2005 | Li |
| 2013/0038323 A1 | 2/2013 | Honkura et al. |
| 2013/0181705 A1 | 7/2013 | Honkura et al. |
| 2016/0238673 A1 | 8/2016 | Honkura |
| 2018/0210040 A1* | 7/2018 | Shimoto ............ G01R 33/0011 |
| 2019/0302195 A1 | 10/2019 | Honkura et al. |
| 2019/0310324 A1 | 10/2019 | Honkura |

FOREIGN PATENT DOCUMENTS

| | | |
|---|---|---|
| JP | 2000-292506 A | 10/2000 |
| JP | 2001-4728 A | 1/2001 |
| JP | 2006-000906 A | 1/2006 |
| JP | 2006-300906 A | 11/2006 |
| JP | 2009-236803 A | 10/2009 |
| JP | 2012-78198 A | 4/2012 |
| JP | 2016-151413 A | 8/2016 |
| JP | 2018-148189 A | 9/2018 |
| JP | 6839399 B1 | 3/2021 |
| WO | WO 2009/044820 A1 | 4/2009 |
| WO | WO 2018/225454 A1 | 12/2018 |

OTHER PUBLICATIONS

International Written Opinion issued Oct. 26, 2021 in International Application No. PCT/JP2021/033344, 4 pgs.
International Search Report issued Oct. 26, 2021 in PCT/JP2021/033344 filed on Sep. 10, 2021, 2 pages.
Japanese Office Action issued Jan. 7, 2025 in Japanese Patent Application No. 2022-553759 (with unedited computer-generated English translation), 6 pages.
Office Action dated May 7, 2025, issued in counterpart JP Application No. 2022-553759, with English translation, (6 pages).

* cited by examiner (a)

(b)

(a)

(b)

(a)

(b)

(a)

(b)

MAGNETO-IMPEDANCE SENSOR ELEMENT

TECHNICAL FIELD

The present invention relates to a magneto-impedance sensor element.

BACKGROUND ART

As a magnetic sensor element having high sensitivity, high responsiveness, and low power consumption, for example, as described in Patent Document 1, various magneto-impedance sensor elements (hereinafter, also referred to as MI sensor element as appropriate) have been developed.

Such MI sensor element includes a magneto-sensitive body and a detection coil wound around the magneto-sensitive body. An external magnetic field can be detected by a voltage generated in the detection coil when a pulse current is applied to the magneto-sensitive body in a state where the external magnetic field acts on the magneto-sensitive body. That is, a voltage corresponding to the intensity of the magnetic field acting on the magneto-sensitive body is output from the detection coil, and the intensity of the magnetic field in a magneto-sensitive direction can be measured by this output. Therefore, it is ideal that no voltage is output to the detection coil in a state where the external magnetic field does not act on the magneto-sensitive body.

PRIOR ART LITERATURE

Patent Documents

Patent Document 1: JP 2012-78198 A

SUMMARY OF THE INVENTION

Problems to be Solved by the Invention

In practice, however, a voltage is output from the detection coil in some cases even in a state where a magnetic field does not act on a magneto-sensitive body. This phenomenon is called origin vibration. The origin vibration is considered to be a factor of offset of the output of the magneto-impedance sensor (hereinafter, appropriately referred to as "MI sensor") using the MI sensor element. Therefore, it is possible to improve the performance of the MI sensor by reducing the origin vibration of the MI sensor element.

The present invention has been made in view of such problems, and an object is to provide a magneto-impedance sensor element configured to reduce origin vibration.

Means for Solving the Problems

A first aspect of the present invention is a magneto-impedance sensor element including: a magneto-sensitive body having electromagnetic properties that vary by a magnetic field externally acting thereon; and a detection coil wound around the magneto-sensitive body, wherein the magneto-impedance sensor element is configured so that a voltage corresponding to an intensity of the magnetic field acting on the magneto-sensitive body is output from the detection coil by applying a pulse current or a high-frequency current to the magneto-sensitive body, and the magneto-sensitive body includes a first magneto-sensitive section and a second magneto-sensitive section that are configured to carry the pulse current or the high-frequency current in mutually opposite directions.

A second aspect of the present invention is a magneto-impedance sensor element including:
- a magneto-sensitive body having electromagnetic properties that vary by a magnetic field externally acting thereon;
- a parallel conductor arranged in parallel with the magneto-sensitive body; and
- detection coil wound around the magneto-sensitive body and the parallel conductor, wherein
- the magneto-impedance sensor element is configured so that a voltage corresponding to an intensity of the magnetic field acting on the magneto-sensitive body is output from the detection coil by applying a pulse current or a high-frequency current to the magneto-sensitive body, and
- the parallel conductor carries a pulse current or a high-frequency current in a direction opposite to that of the pulse current or the high-frequency current being applied to the magneto-sensitive body.

Effects of the Invention

In the magneto-impedance sensor element of the first aspect, the magneto-sensitive body includes a first magneto-sensitive section and a second magneto-sensitive section that are configured to carry the pulse current or the high-frequency current in mutually opposite directions. Thus, origin vibration can be reduced.

The magneto-impedance sensor element of the second aspect includes the parallel conductor. And, in this configuration, the parallel conductor carries a pulse current or a high-frequency current in a direction opposite to that of the pulse current or the high-frequency current applied to the magneto-sensitive body. Thus, origin vibration can be reduced.

As described above, according to the above aspect, it is possible to provide a magneto-impedance sensor element configured to reduce origin vibration.

MODES FOR CARRYING OUT THE INVENTION

Figure 1:
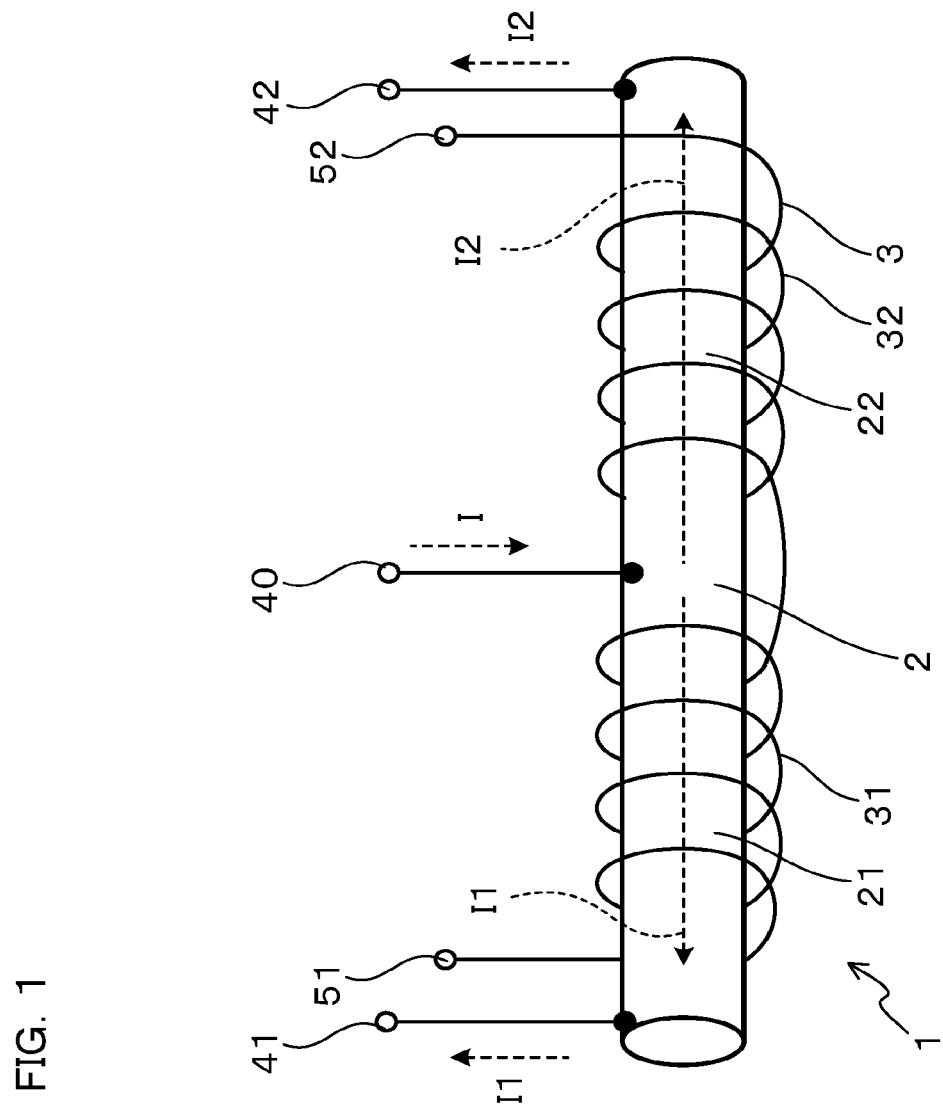
FIG. 1 is an explanatory view of an MI sensor element in a first embodiment.

The magneto-impedance sensor element of the above aspects can be used for, for example, an electronic compass, a foreign substance detection sensor, a magnetic positioning system, and the like.

The magneto-sensitive body may be formed of an amorphous wire, which is a linear member including an amorphous magnetic body, for example. The magneto-sensitive body is configured to carry a pulse current or a high-frequency current in an axial direction thereof.

In the impedance sensor element of the first aspect, the detection coil includes a first coil section wound around the first magneto-sensitive section and a second coil section wound around the second magneto-sensitive section, and the first coil section and the second coil section are electrically connected in series to each other and have the same winding orientation. In this case, it is possible to easily and accurately manufacture the MI sensor element.

The first magneto-sensitive section and the second magneto-sensitive section may be integrally formed as one magneto-sensitive wire. In this case, it is possible to easily and accurately manufacture the MI sensor element. The first magneto-sensitive section and the second magneto-sensitive section are less likely to have a difference in electromagnetic characteristics, and therefore origin vibration is more easily reduced.

The MI sensor element may include a substrate on which the magneto-sensitive body and the detection coil are mounted, the substrate can be provided with a ground layer that is grounded, and both end parts of the magneto-sensitive body can be electrically connected to the ground layer. In this case, the number of input/output terminals for pulse current or high-frequency current in the MI sensor element can be reduced, and the section where the path for the pulse current or the high-frequency current is asymmetric can be reduced except for the magneto-sensitive body. As a result, it is possible to facilitate manufacturing of the MI sensor element, and it is possible to more effectively reduce origin vibration.

The MI sensor element can include a first terminal drawn out from one end of the first magneto-sensitive section and a second terminal drawn out from one end of the second magneto-sensitive section, and the first terminal and the second terminal can be electrically independent of each other. In this case, in the electric circuit connected to the MI sensor element, fine adjustment of the pulse current or the high-frequency current applied to the first terminal and the second terminal can be performed by adjusting the impedance of the wiring connected respectively to the first terminal and the second terminal.

In the magneto-impedance sensor element of the second aspect, the parallel conductor may be connected in series with the magneto-sensitive body. In this case, the pulse current or the high-frequency current applied to the parallel conductor can be easily synchronized with the pulse current or the high-frequency current applied to the magneto-sensitive body. Therefore, reduction of origin vibration can be more easily achieved.

The parallel conductor can be arranged adjacent to the magneto-sensitive body in one direction orthogonal to the axial direction of the magneto-sensitive body. In this case, disturbance of the current distribution in the parallel conductor can be curtailed. Therefore, origin vibration can be more effectively reduced.

First Embodiment

Embodiments of the MI sensor element will be described with reference to FIGS. 1 to 11.

As illustrated in FIG. 1, an MI sensor element 1 of this embodiment includes a magneto-sensitive body 2 and a detection coil 3 wound around the magneto-sensitive body 2. The MI sensor element 1 is configured so that a voltage corresponding to an intensity of the magnetic field acting on the magneto-sensitive body 2 is output from the detection coil 3 by applying a pulse current or a high-frequency current to the magneto-sensitive body 2. In this embodiment, a pulse current is applied to the magneto-sensitive body 2.

In the magneto-sensitive body 2, electromagnetic properties vary by a magnetic field externally acting thereon. In this embodiment, the magneto-sensitive body 2 is formed of an amorphous wire. The magneto-sensitive body 2 is configured to carry a pulse current in an axial direction thereof.

As illustrated in FIG. 1, the magneto-sensitive body 2 includes a first magneto-sensitive section 21 and a second magneto-sensitive section 22 configured to carry pulse currents I1 and I2 in mutually opposite directions.

In this embodiment, the first magneto-sensitive section 21 and the second magneto-sensitive section 22 are integrally formed as one magneto-sensitive wire. That is, the magneto-sensitive body 2 is formed of one amorphous wire. The MI sensor element 1 includes a central terminal 40 drawn out from a central part in the axial direction of the magneto-sensitive body 2.

Figure 2:
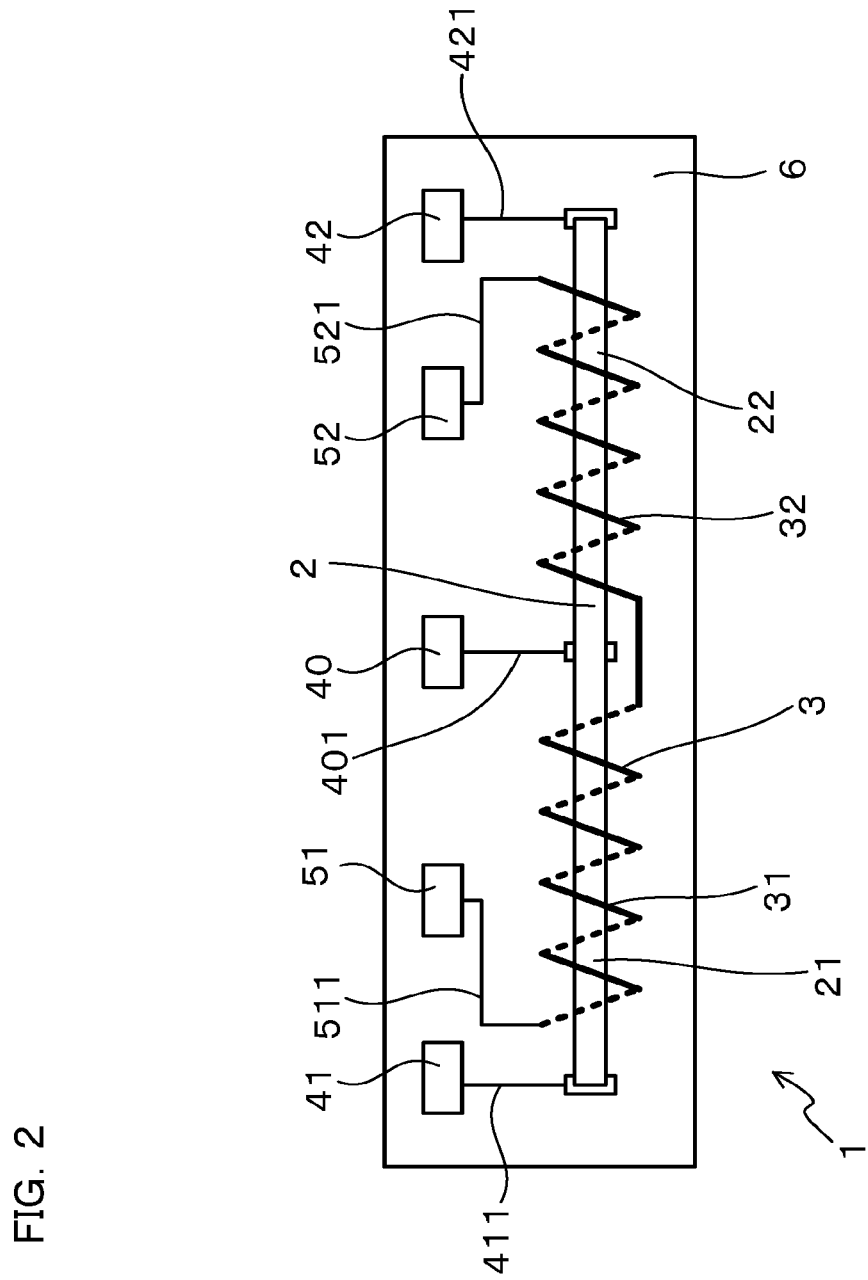
FIG. 2 is an explanatory view of the MI sensor element viewed from a normal direction of a substrate in the first embodiment.

As illustrated in FIGS. 1 and 2, the MI sensor element 1 includes a first terminal 41 drawn out from one end of the first magneto-sensitive section 21 and a second terminal 42 drawn out from one end of the second magneto-sensitive section 22. In this embodiment, the first terminal 41 and the second terminal 42 are respectively drawn out from both end parts in the axial direction of the magneto-sensitive body 2.

In the case of this embodiment, a part of the magneto-sensitive body 2 from a site from which the central terminal 40 is drawn out to a site from which the first terminal 41 is drawn out is the first magneto-sensitive section 21. A part of the magneto-sensitive body 2 from a site from which the central terminal 40 is drawn out to a site from which the second terminal 42 is drawn out is the second magneto-sensitive section 22.

The detection coil 3 includes a first coil section 31 wound around the first magneto-sensitive section 21 and a second coil section 32 wound around the second magneto-sensitive section 22. The first coil section 31 and the second coil section 32 are electrically connected in series to each other, and have the same winding orientation.

Both ends of the detection coil 3 are connected to output terminals 51 and 52, respectively. In this embodiment, an end part of the first coil section 31 opposite to the second coil section 32 is connected to one output terminal 51, and an end part of the second coil section 32 opposite to the first coil section 31 is connected to the other output terminal 52.

In the detection coil 3, the first coil section 31 and the second coil section 32 have substantially the same number of turns. Note that FIGS. 1 and 2 are merely explanatory views, and the number of turns of the detection coil 3 is not particularly limited. As illustrated in FIG. 2, each section of the detection coil 3 is inclined with respect to the circumferential direction of the magneto-sensitive body 2 when viewed from the direction orthogonal to the axial direction. However, in the figure, this inclination angle is illustrated to be larger than the actual inclination angle. Although not illustrated, the detection coil 3 is provided on an outer peripheral surface of an insulation layer covering the outer periphery of the magneto-sensitive body 2. The detection coil 3 can be formed of plating, for example.

As illustrated in FIG. 2, the MI sensor element 1 includes a substrate 6 on which the magneto-sensitive body 2 and the detection coil 3 are mounted. That is, the magneto-sensitive body 2 in a state in which the detection coil 3 is wound as described above is fixed to the substrate 6 along the surface of the substrate 6. The first terminal 41, the second terminal 42, the central terminal 40, and the output terminals 51 and 52 are arranged on the substrate 6. These terminals may be formed on the surface of the substrate 6 by, for example, plating or the like.

Connection wirings 411, 421, and 401 electrically connecting the first terminal 41, the second terminal 42, and the central terminal 40, respectively, to corresponding sections of the magneto-sensitive body 2 are also formed on the substrate 6 by, for example, plating or the like. Similarly, connection wirings 511 and 521 electrically connecting between the output terminals 51 and 52 and the detection coil 3 are also formed on the substrate 6 by, for example, plating or the like.

As illustrated in FIG. 1, the MI sensor element 1 configured as described above is configured to be able to apply a pulse current from the central terminal 40 to the magneto-sensitive body 2. In this case, the pulse current flows in a branched manner into the first magneto-sensitive section 21 and the second magneto-sensitive section 22 at the central part of the magneto-sensitive body 2, and flows toward the first terminal 41 and the second terminal 42, respectively. That is, the pulse current I1 flowing through the first magneto-sensitive section 21 and the pulse current I2 flowing through the second magneto-sensitive section 22 flow in mutually opposite directions.

Figure 3:
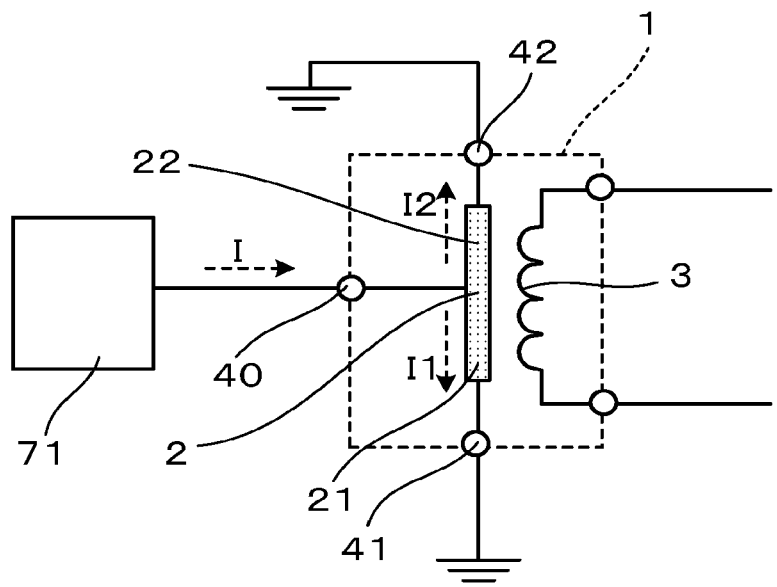
FIG. 3 is a circuit explanatory view in a state in which a central terminal of the MI sensor element is connected to a pulse power source in the first embodiment.

Such a manner of applying the pulse current to the magneto-sensitive body 2 can be achieved by connecting a peripheral circuit illustrated in a simplified manner in FIG. 3, for example. That is, a pulse power source 71 that generates a pulse current is connected to the central terminal 40. Then, the first terminal 41 and the second terminal 42 are each grounded. Then, by applying a pulse current from the pulse power source 71 to the central part of the magneto-sensitive body 2 via the central terminal 40, it is possible to apply the pulse currents I1 and I2 to the first magneto-sensitive section 21 and the second magneto-sensitive section 22 of the magneto-sensitive body 2 in mutually opposite directions.

Here, the pulse current I1 flowing through the first magneto-sensitive section 21 and the pulse current I2 flowing through the second magneto-sensitive section 22 are made substantially equal in magnitude. The pulse current I1 and the pulse current I2 flow in synchronization with each other.

Figure 4:
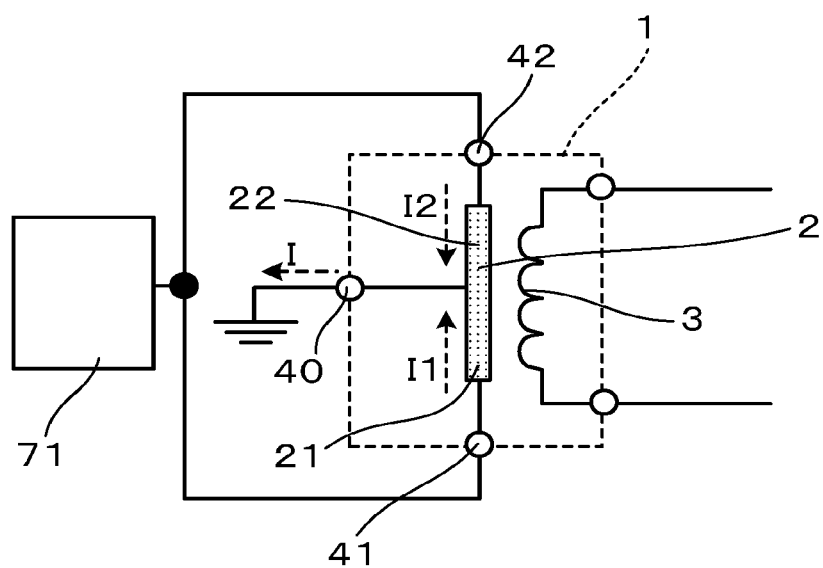
FIG. 4 is a circuit explanatory view in a state in which a first terminal and a second terminal of the MI sensor element are connected to the pulse power source in the first embodiment.
Figure 5:
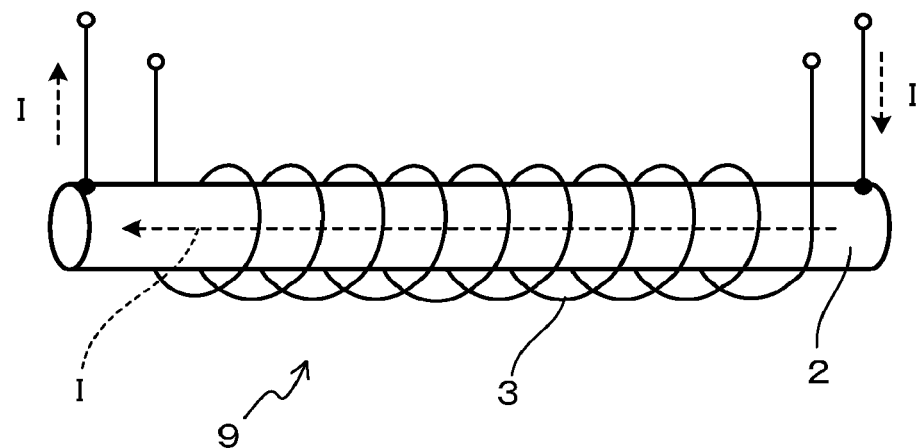
FIG. 5 is an explanatory view of an MI sensor element in a comparative embodiment.

The pulse current I1 and the pulse current I2 are only required to be opposite in direction to each other. Therefore, as illustrated in FIG. 4, it is also possible to apply a pulse current to the magneto-sensitive body 2 so as to flow from the first terminal 41 and the second terminal 42 toward the central terminal 40. In this case, a peripheral circuit can have a configuration in which the pulse power source 71 is connected to the first terminal 41 and the second terminal 42 and the central terminal 40 is grounded.

The peripheral circuits illustrated in FIGS. 3 and 4 are connected to a control unit, and the control unit controls the pulse power source 71 and processes an output signal from the detection coil 3. The control unit can be constituted by a microcomputer including a CPU, a ROM, and a RAM.

Next, actions and effects of this embodiment will be described.

In the magneto-impedance sensor element 1, the magneto-sensitive body 2 includes the first magneto-sensitive section 21 and the second magneto-sensitive section 22 configured to carry a pulse current in mutually opposite directions. Thus, origin vibration can be reduced.

It is considered that the origin vibration is caused by a magnetic field variation generated by the pulse current applied to the magneto-sensitive body 2. That is, as in an MI sensor element 9 of the comparative embodiment illustrated in FIG. 5, when a pulse current I flows through the magneto-sensitive body 2 only in one direction, a magnetic field variation caused by this pulse current I occurs. Then, it is considered that this magnetic field variation causes an inductive voltage in the detection coil 3, whereby even when no external magnetic field acts, an output is generated in the detection coil 3, that is, origin vibration is generated.

Therefore, as illustrated in FIG. 1, the MI sensor element 1 of this embodiment is configured to apply pulse currents I1 and I2 opposite in direction to each other respectively to the first magneto-sensitive section 21 and the second magneto-sensitive section 22 in the magneto-sensitive body 2. This can curtail a magnetic field variation caused by the above-described pulse current. That is, the magnetic field variation caused by the pulse current I1 of the first magneto-sensitive section 21 and the magnetic field variation caused by the pulse current I2 of the second magneto-sensitive section 22 cancel each other. Therefore, in the MI sensor element 1 of this embodiment, the magnetic field variation caused by the pulse current is reduced, and the origin vibration is reduced.

By reducing the origin vibration, the offset of the MI sensor element 1 can be curtailed. In the MI sensor element 1, the magnetic field applied thereto and the output voltage have a certain relationship (hereinafter, also referred to as input/output characteristics) therebetween, and based on this relationship, the intensity of the applied magnetic field can be detected from the output voltage (see FIG. 7).

Figure 6:
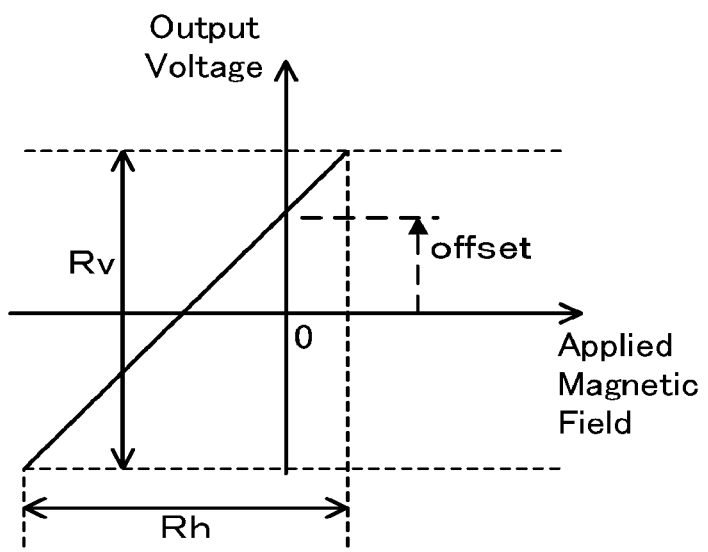
FIG. 6 is a diagram illustrating a relationship between a magnetic field and an output voltage when an offset occurs in the comparative embodiment.

However, although the input/output characteristics exhibit stable sensitivity in a predetermined output voltage range Rv, the sensitivity decreases outside the range Rv. That is, the intensity of the magnetic field that can be substantially measured is limited to a range Rh corresponding to the predetermined output voltage range Rv. In such the MI sensor element 1, if a large offset occurs as illustrated in FIG. 6, the range Rh within which the magnetic field can be measured becomes narrower on the positive side or the negative side. In the case of the state illustrated in the figure, the range Rh of the measurable magnetic field on the positive side is narrowed. In the axial direction of the MI sensor element, the intensity of the magnetic field on one side is on the positive side, and the intensity of the magnetic field in the opposite orientation is on the negative side.

Figure 7:
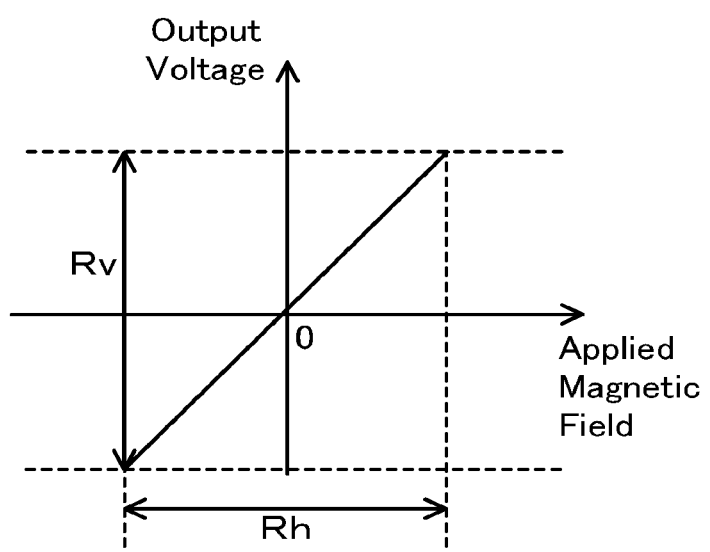
FIG. 7 is a diagram illustrating a relationship between a magnetic field and an output voltage in the first embodiment.

In contrast, in the MI sensor element 1 of this embodiment, the origin vibration is reduced as described above, and thus the offset can be reduced. As illustrated in FIG. 7, reducing the offset makes it possible to surely broaden the range Rh of the measurable magnetic field on both the positive side and the negative side.

Not only that, even when pulse currents are applied to the magneto-sensitive body 2 in mutually opposite directions, the pulse currents have no effect on the measurement sensitivity of the external magnetic field.

In the first place, the MI sensor element 1 uses an electromotive force generated in the detection coil 3 due to time change of a magnetic flux interlinked with the detection coil 3 (magnetic flux in the axial direction of the magneto-sensitive body 2) in the magneto-sensitive body 2. For easy understanding, first, the measurement principle using the MI sensor element 9 of the comparative embodiment (FIG. 5) will be described with reference to FIGS. 8 and 9.

Figure 8:
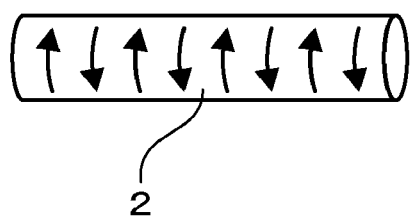
FIG. 8 is an explanatory view illustrating a change in electron spin of the MI sensor element when a pulse current is applied in a state in which a magnetic field is not acting in the comparative embodiment.
Figure 8:
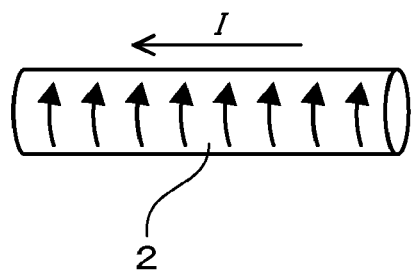

The magneto-sensitive body 2 has a magnetic domain structure in which a large number of magnetic domains are arranged in the axial direction. As in FIG. 8(*a*), in each magnetic domain, an electron spin is formed in a direction along the circumferential direction, and the orientations of the electron spins in adjacent magnetic domains are opposite to each other. In FIG. 8, an arrow drawn along the outer peripheral surface of the magneto-sensitive body 2 indicates the orientation of the electron spin. The same applies to FIGS. 9 to 11.

Under the condition where an external magnetic field is not applied, the electron spin maintains this state. In this state, as illustrated in FIG. 8(*b*), when the pulse current I is applied to the magneto-sensitive body 2, the orientations of the electron spins are aligned according to the Ampere's law. However, no change occurs in the vector component of the electron spin in the direction interlinked with the detection coil 3, that is, the axial direction of the magneto-sensitive body 2. That is, the magnetic moment in the axial direction does not change. Therefore, when there is no external magnetic field, basically no voltage is generated in the detection coil 3.

Figure 9:
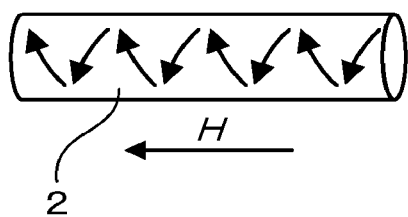
FIG. 9 is an explanatory view illustrating a change in electron spin of the MI sensor element when a pulse current is applied in a state in which a magnetic field is acting in the comparative embodiment.
Figure 9:
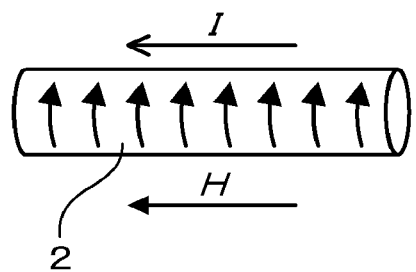

On the other hand, as illustrated in FIG. 9(*a*), when an external magnetic field H acts in the axial direction (that is, the magneto-sensitive direction of the MI sensor element), the electron spin is inclined by the external magnetic field H. When a pulse current is applied from this state as illustrated in FIG. 9(*b*), the orientations of the electron spins are aligned in the circumferential direction. This changes the magnitude of the vector component of the electron spin in the direction interlinked with the detection coil 3, that is, the axial direction of the magneto-sensitive body 2. A voltage is induced in the detection coil 3 by this magnetic flux change. The intensity of the magnetic field can be detected by the magnitude of the output voltage of the detection coil 3.

Figure 10:
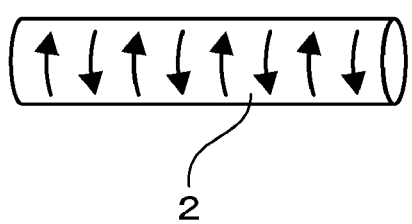
FIG. 10 is an explanatory view illustrating a change in electron spin of the MI sensor element when a pulse current is applied in a state in which a magnetic field is not acting in the first embodiment.
Figure 10:
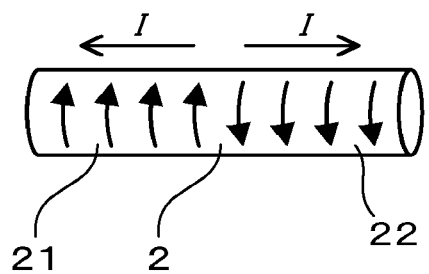

Similarly, in the MI sensor element 1 of the present embodiment, in a state where there is no external magnetic field, as illustrated in FIG. 10, by applying the pulse current I, the orientations of the electron spins in the magneto-sensitive body 2 are partially reversed, but no change occurs in the vector component of the electron spin in the axial direction. The difference from the comparative embodiment is that in the first magneto-sensitive section 21 and the second magneto-sensitive section 22 configured so that the pulse currents are in mutually opposite directions, the electron spins at the time of applying the pulse current I are opposite in direction.

Figure 11:
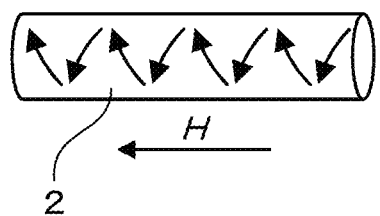
FIG. 11 is an explanatory view illustrating a change in electron spin of the MI sensor element when a pulse current is applied in a state in which a magnetic field is acting in the first embodiment.
Figure 11:
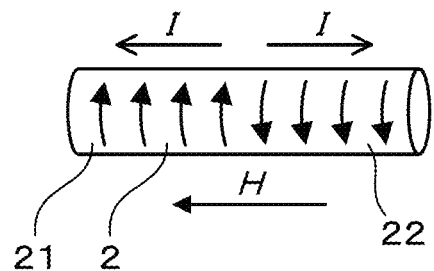

As illustrated in FIGS. 11(*a*) and (*b*), also when the pulse current I is applied under the condition where the external magnetic field H acts in the axial direction, the magnitude of the vector of the electron spin in the direction interlinked with the detection coil 3, that is, the axial direction of the magneto-sensitive body 2 changes. This embodiment is different from the comparative embodiment in that the orientations of the electron spins at the time of applying the pulse current are opposite, but the amount of change in the vector component in the axial direction of the electron spins before and after the application of the pulse current I is the same.

Therefore, even if the pulse currents I are applied to the magneto-sensitive body 2 in mutually opposite directions, the pulse currents I have no effect on the detection sensitivity itself of the external magnetic field H.

In the MI sensor element 9 of the comparative embodiment, the origin vibration may occur as described above in some cases. That is, under the condition where the external magnetic field does not act as illustrated in FIG. 8(*b*), a voltage may be induced in the detection coil 3 where an output voltage is not generated under ordinary circumstances. The inventors attribute this origin vibration to the change in a magnetic field generated by application of a pulse current. It is considered that the magnetic field generated by this pulse current is canceled and reduced by applying the pulse currents in mutually opposite directions as illustrated in FIG. 1. Then, the inventors adopt a configuration in which pulse currents are applied to the magneto-sensitive body 2 in mutually opposite directions, and have succeeded in reducing origin vibration (see the experimental example described below).

As illustrated in FIG. 1, the detection coil 3 includes the first coil section 31 and the second coil section 32. The first coil section 31 and the second coil section 32 are electrically connected in series to each other, and have the same winding orientation. This makes it possible to easily and accurately manufacture the MI sensor element 1.

The first magneto-sensitive section 21 and the second magneto-sensitive section 22 are integrally formed as one magneto-sensitive wire. Therefore, it is possible to easily and accurately manufacture the MI sensor element 1. The first magneto-sensitive section 21 and the second magneto-sensitive section 22 are less likely to have a difference in electromagnetic properties, and therefore origin vibration is more easily reduced.

As described above, according to this embodiment, it is possible to provide a magneto-impedance sensor element configured to reduce origin vibration.

Second Embodiment

Figure 12:
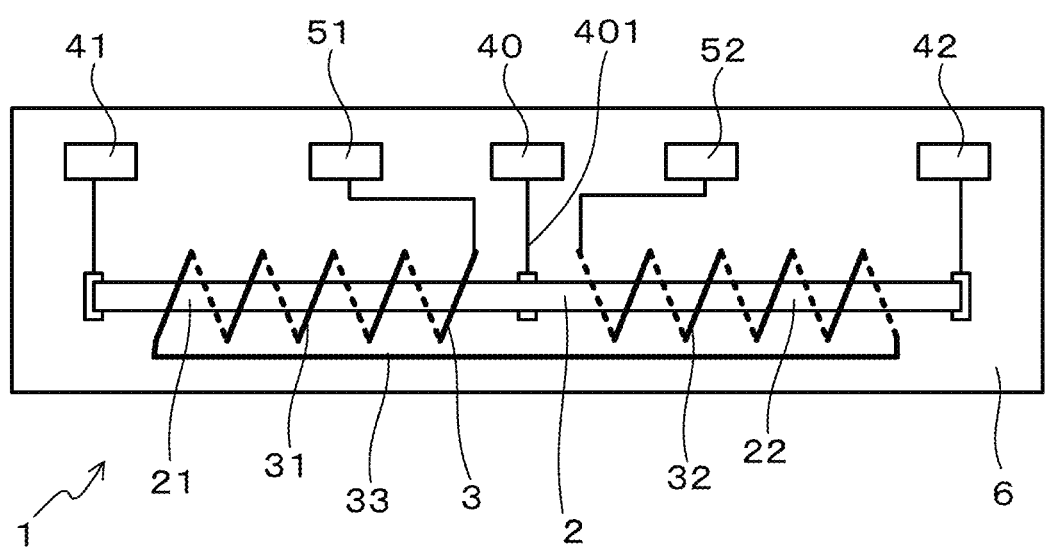
FIG. 12 is an explanatory view of an MI sensor element in a second embodiment.

As illustrated in FIG. 12, this embodiment is a mode in which the first coil section 31 and the second coil section 32 are electrically connected to each other at end parts on opposite sides in the axial direction.

A connection wiring 33 connecting the first coil section 31 and the second coil section 32 is formed, for example, on the surface of the substrate 6 by plating or the like. The first coil section 31 and the second coil section 32 are electrically connected to the output terminals 51 and 52 respectively, at the end parts in the positions close to each other in the axial direction.

The rest is the same as in the first embodiment. Among the reference signs used in the second and subsequent embodiments, the same reference signs as those used in the above-described embodiment represent the same components and the like as those in the above-described embodiment unless otherwise specified.

This embodiment also achieves the same actions and effects as those of the first embodiment.

Experimental Example

Figure 13:
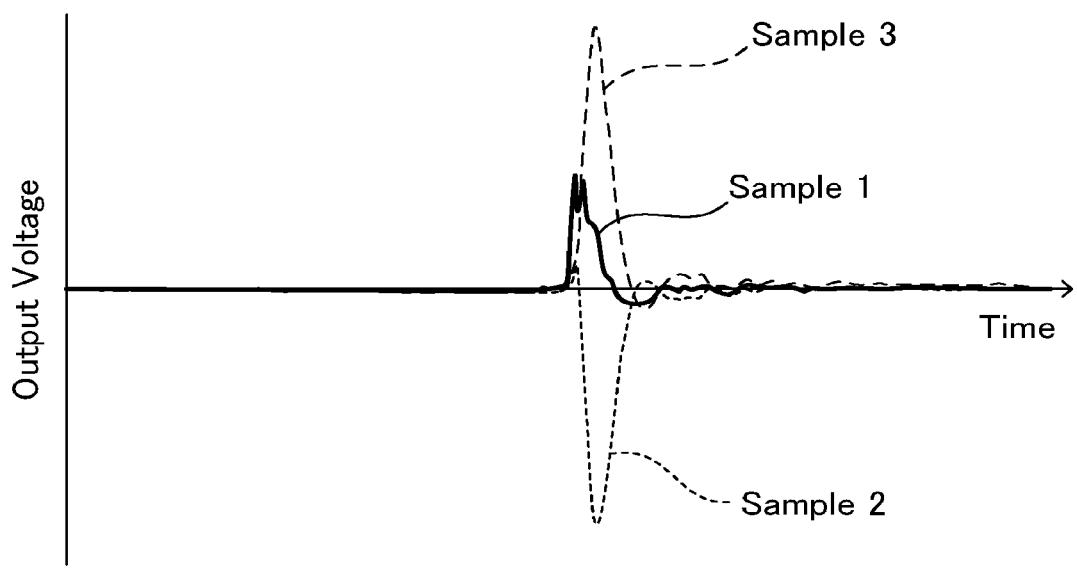
FIG. 13 is a diagram illustrating an observation result of origin vibration in an experimental example.

In this example, as illustrated in FIG. 13, an effect verification test of the MI sensor element of the present disclosure was conducted.

As samples, the MI sensor element 1 illustrated in the second embodiment (FIG. 12) was prepared as Sample 1, and the MI sensor element 9 illustrated in the comparative embodiment (FIG. 5) was prepared as Sample 2 and Sample 3.

Sample 2 and Sample 3 have the same structure of the MI sensor element 9. The specific structures of Sample 2 and Sample 3 are the same as those of Sample 1 (that is, the second embodiment illustrated in FIG. 12) except for absence of the central terminal 40 and a connection wiring 401 between the central terminal 40 and the magneto-sensitive body 2.

These samples were placed in a space where no external magnetic field acts. In addition, the magneto-sensitive body 2 was applied with a pulse current having a predetermined magnitude. Here, in Sample 1, a pulse current was applied in a direction from the central terminal 40 toward the first terminal 41 and the second terminal 42. For Sample 2 and Sample 3, a pulse current was applied in a direction from one end to the other end of the magneto-sensitive body 2. In this regard, the pulse current applied to Sample 2 and the pulse current applied to Sample 3 were in mutually opposite in direction. The pulse current applied to each sample had the same magnitude and the same pulse waveform. Specifically, for Sample 1, the current value input to the central terminal 40 was twice the current value input to one end of each magneto-sensitive body 2 in Sample 2 and Sample 3.

Then, the voltage (output voltage) generated in the detection coil 3 in each sample was monitored. The result is given in FIG. 13. As indcted by the figure, the output voltage generated in Sample 1 is reduced to half or less of each output voltages generated in Sample 2 and Sample 3. That is, in Sample 1, the origin vibration is reduced.

The output voltage of Sample 2 and the output voltage of Sample 3 have opposite signs. This is considered because the direction of the pulse current applied to Sample 2 and the direction of the pulse current applied to Sample 3 are opposite, and therefore the orientation of the magnetic fields generated by these pulse currents also becomes opposite, and the origin vibration caused by each magnetic field also has an inverse orientation.

As described above, in this example, it has been confirmed that the MI sensor element 1 of the second embodiment can reduce the origin vibration.

Third Embodiment

Figure 14:
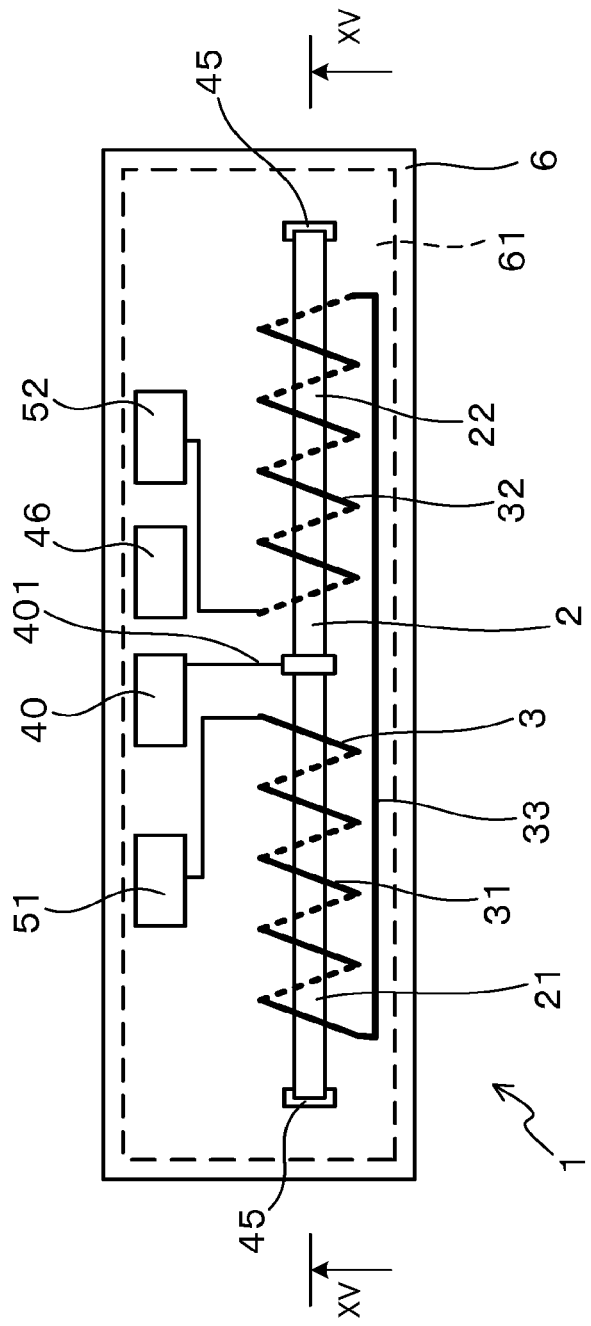
FIG. 14 is an explanatory view of the MI sensor element viewed from a normal direction of a substrate in a third embodiment.
Figure 15:
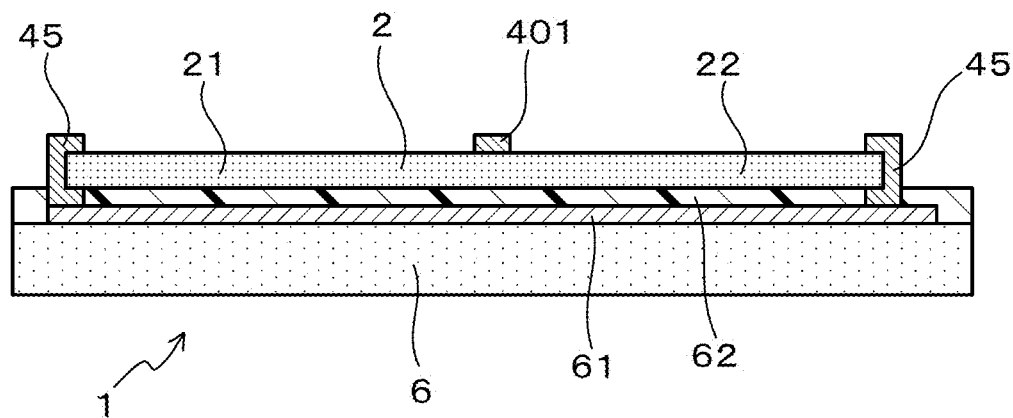
FIG. 15 is a cross-sectional view taken along line XV-XV of FIG. 14.

As illustrated in FIGS. 14 and 15, this embodiment is a mode in which the substrate 6 is provided with a ground layer 61.

The ground layer 61 is electrically grounded. Both end parts of the magneto-sensitive body 2 are electrically connected to the ground layer 61. In FIG. 15, the detection coil 3 is not illustrated.

The ground layer 61 is formed in a planar shape so as to spread two-dimensionally in the substrate 6. The ground layer 61 is formed such that the entire magneto-sensitive body 2 is arranged inside when viewed from the normal direction of the substrate 6. In this embodiment, the ground layer 61 is formed such that the magneto-sensitive body 2, the output terminals 51 and 52, the central terminal 40, and a ground terminal 46 are arranged inside the contour of the ground layer 61 when viewed from the normal direction of the substrate 6.

The ground terminal 46 is a terminal electrically connected to the ground layer 61 and exposed to the surface of the substrate 6. The ground terminal 46 is connected to an external ground wiring, whereby the ground layer 61 is grounded.

The magneto-sensitive body 2 is electrically connected at its both end parts to the ground layer 61 via a joint conductor 45. Parts of the magneto-sensitive body 2 other than the both end parts are electrically insulated from the ground layer 61 by an insulation layer 62. The central terminal 40 is electrically connected to a central site of the magneto-sensitive body 2 via the connection wiring 401.

The rest is the same as in the second embodiment.

In this embodiment, it is possible to reduce the number of input terminals for the pulse current in the MI sensor element 1. Therefore, it is possible to facilitate manufacturing of the MI sensor element 1. It is also possible to reduce a part having an asymmetric path of the pulse current other than the magneto-sensitive body 2. Due to this configuration, origin vibration can be more effectively reduced.

Other than the above, the same actions and effects as in the first embodiment are achieved.

Fourth Embodiment

Figure 16:
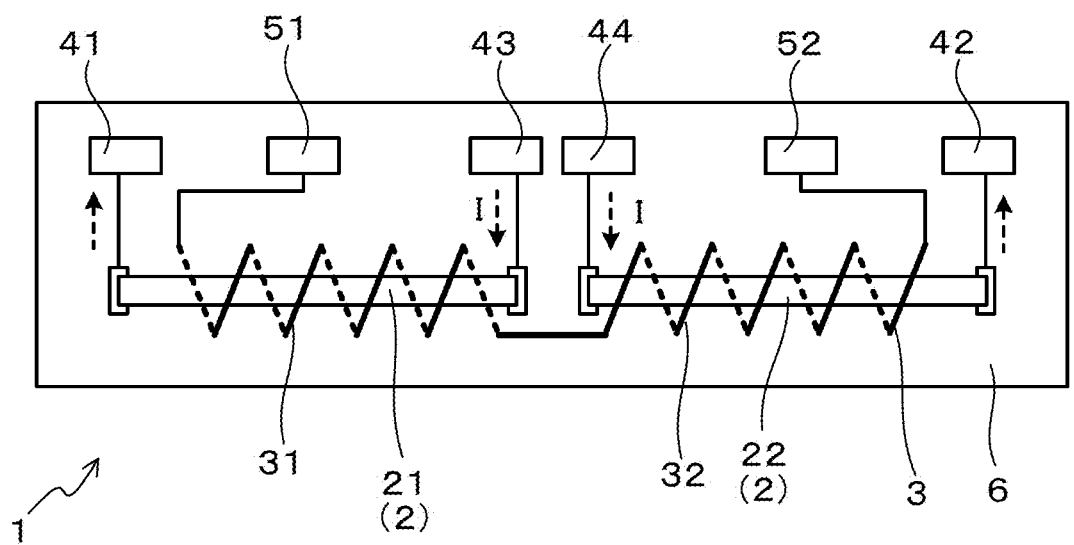
FIG. 16 is an explanatory view of an MI sensor element in a fourth embodiment.

As illustrated in FIG. 16, this embodiment is a mode of the MI sensor element 1 in which the magneto-sensitive body 2 is divided into plural pieces and arranged.

That is, in this embodiment, the first magneto-sensitive section 21 and the second magneto-sensitive section 22 are individually constituted of a magneto-sensitive wire. The first magneto-sensitive section 21 and the second magneto-sensitive section 22 are arranged side by side in the axial direction. In particular, in this embodiment, the first magneto-sensitive section 21 and the second magneto-sensitive section 22 are arranged on the same straight line.

The first magneto-sensitive section 21 and the second magneto-sensitive section 22 each have both end parts connected with a pair of terminals. That is, the both end parts of the first magneto-sensitive section 21 are connected with the first terminal 41 and a third terminal 43. The both end parts of the second magneto-sensitive section 22 are connected with the second terminal 42 and a fourth terminal 44. The third terminal 43 is connected to the first magneto-sensitive section 21 at its end close to the second magneto-sensitive section 22, and the fourth terminal 44 is connected to the second magneto-sensitive section 22 at its end close to the first magneto-sensitive section 21.

The first magneto-sensitive section 21 and the second magneto-sensitive section 22 are electrically independent of each other in the element. However, the first magneto-sensitive section 21 and the second magneto-sensitive section 22 can be electrically connected in the element.

In this embodiment, the first magneto-sensitive section 21 and the second magneto-sensitive section 22 each can be formed of a magneto-sensitive wire having substantially equal diameter, length, and electromagnetic properties. For example, the first magneto-sensitive section 21 and the second magneto-sensitive section 22 each can be individually formed of a magneto-sensitive wire by cutting a single magneto-sensitive wire integrally manufactured.

In this embodiment, for example, pulse currents are applied from the third terminal 43 and the fourth terminal 44 to the first magneto-sensitive section 21 and the second magneto-sensitive section 22, respectively. Alternatively, pulse currents are applied from the first terminal 41 and the second terminal 42 to the first magneto-sensitive section 21 and the second magneto-sensitive section 22, respectively. Thus, pulse currents mutually opposite in direction are respectively applied to the first magneto-sensitive section 21 and the second magneto-sensitive section 22. The application of the pulse currents to the first magneto-sensitive section 21 and the second magneto-sensitive section 22 is performed in synchronization with each other.

The rest is the same as in the first embodiment.

In this embodiment, it is possible to reliably apply the first magneto-sensitive section 21 and the second magneto-sensitive section 22 respectively with pulse currents in mutually opposite directions.

Other than the above, the same actions and effects as in the first embodiment are achieved.

Fifth Embodiment

Figure 17:
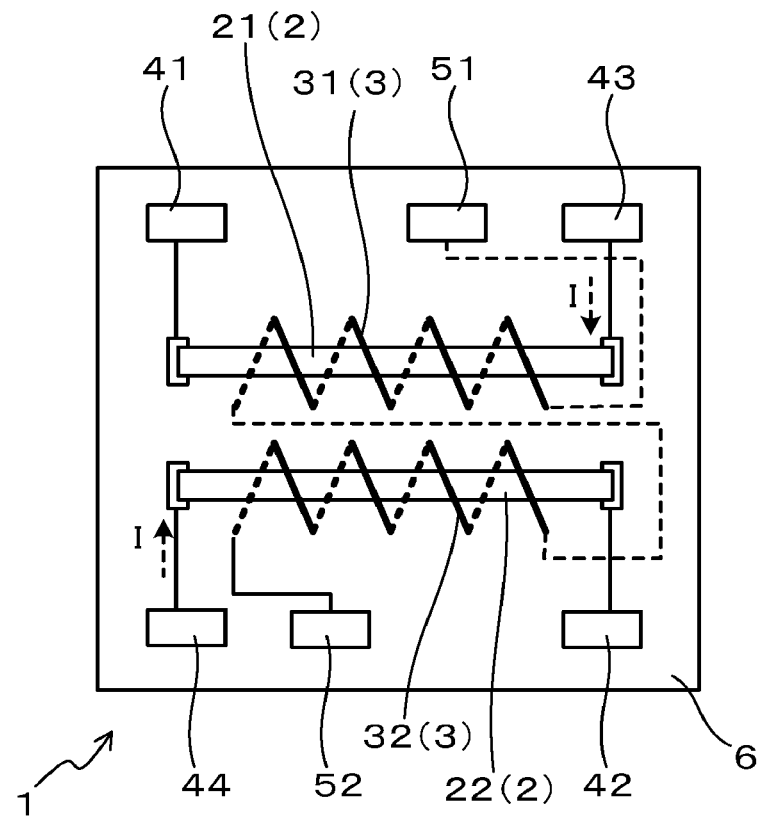
FIG. 17 is an explanatory view of an MI sensor element in a fifth embodiment.

As illustrated in FIG. 17, this embodiment is a mode of the MI sensor element 1 in which the magneto-sensitive body 2 is divided into plural pieces and arranged in parallel.

That is, the first magneto-sensitive section 21 and the second magneto-sensitive section 22 are arranged in parallel. In the detection coil 3, the first coil section 31 and the second coil section 32 are electrically connected in series to each other.

The first magneto-sensitive section 21 and the second magneto-sensitive section 22 are arranged in parallel to each other and are arranged side by side in a direction orthogonal to the axial direction. The first magneto-sensitive section 21 and the second magneto-sensitive section 22 have the both end parts arranged at the equivalent position in the axial direction.

The rest is the same as in the first embodiment.

Also in this embodiment, for example, pulse currents are applied from the third terminal 43 and the fourth terminal 44, to the first magneto-sensitive section 21 and the second magneto-sensitive section 22, respectively. Alternatively, pulse currents are applied from the first terminal 41 and the second terminal 42 to the first magneto-sensitive section 21 and the second magneto-sensitive section 22, respectively. Thus, pulse currents mutually opposite in direction are respectively applied to the first magneto-sensitive section 21 and the second magneto-sensitive section 22. The application of the pulse currents to the first magneto-sensitive section 21 and the second magneto-sensitive section 22 is performed in synchronization with each other.

Meanwhile, the first coil section 31 and the second coil section 32 do not have to be directly connected, and the output signals generated from these coil section can be synthesized by calculation in the control unit.

The rest is the same as in the first embodiment.

In this embodiment, the axial length of the magneto-sensitive body 2 can be shorten. Therefore, it is possible to improve the sensing resolution in the axial direction of the MI sensor element 1. Further, downsizing of the MI sensor element 1 in the axial direction is facilitated.

The rest is the same as in the fourth embodiment.

Sixth Embodiment

Figure 18:
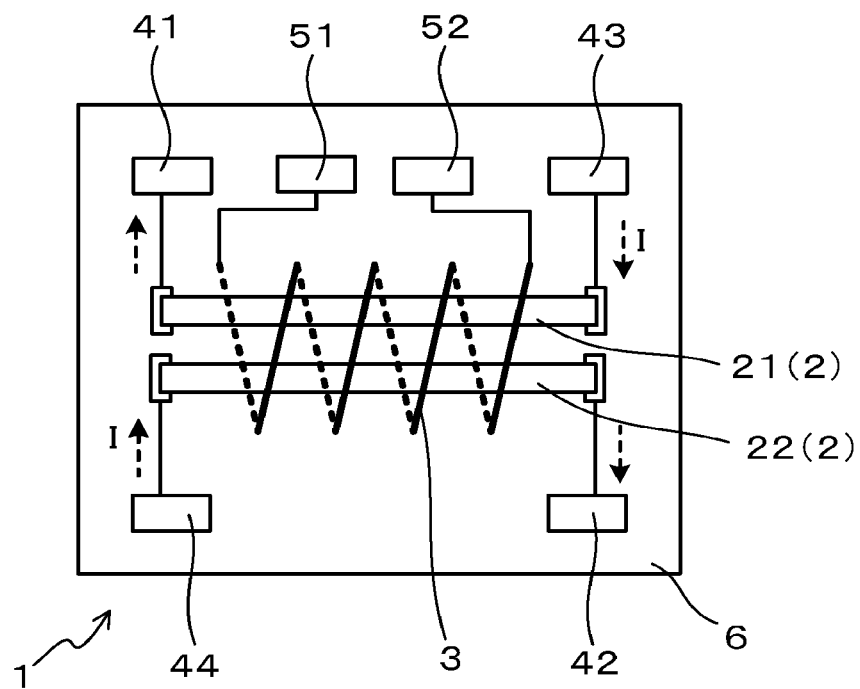
FIG. 18 is an explanatory view of an MI sensor element in a sixth embodiment.

As illustrated in FIG. 18, this embodiment is a mode of the MI sensor element 1 in which the detection coil 3 is wound around the first magneto-sensitive section 21 and the second magneto-sensitive section 22 that are arranged in parallel.

Also in this embodiment, the first magneto-sensitive section 21 and the second magneto-sensitive section 22 are applied with pulse currents mutually opposite in direction. Both ends of the detection coil 3 are connected to the pair of output terminals 51 and 52 respectively.

In this embodiment, an output voltage corresponding to the magnetic field is output from the both ends of the detection coil 3. That is, the output voltage is output between the pair of output terminals 51 and 52.

The rest is the same as in the fifth embodiment.

In this embodiment, it is possible to facilitate further downsizing of the MI sensor element 1 in the direction orthogonal to the axial direction.

Other than the above, the same actions and effects as in the first embodiment are achieved.

Seventh Embodiment

Figure 19:
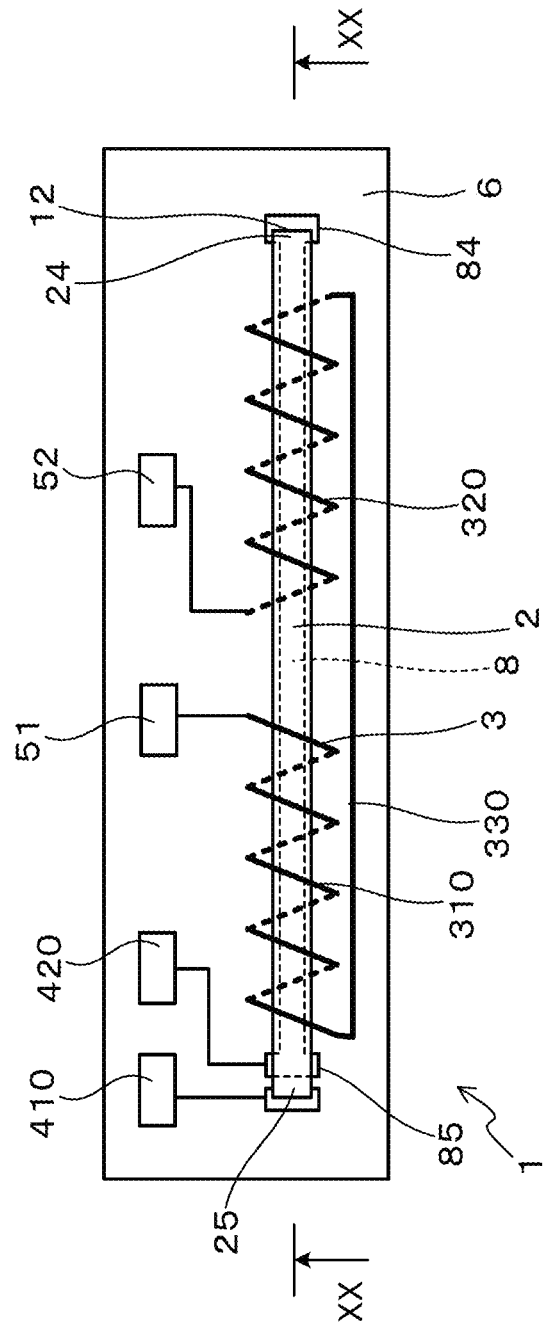
FIG. 19 is an explanatory view of an MI sensor element in a seventh embodiment.
Figure 20:
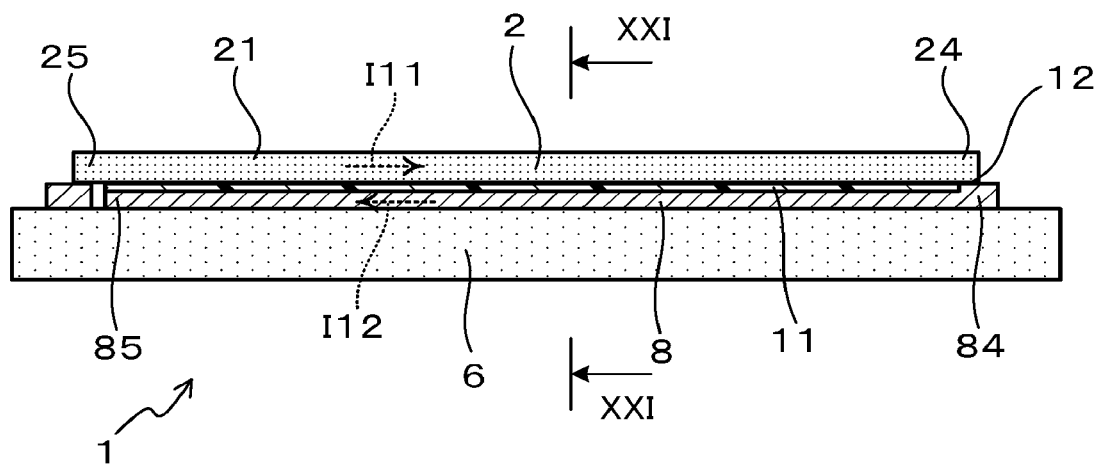
FIG. 20 is a cross-sectional view taken along line XX-XX of FIG. 19.
Figure 21:
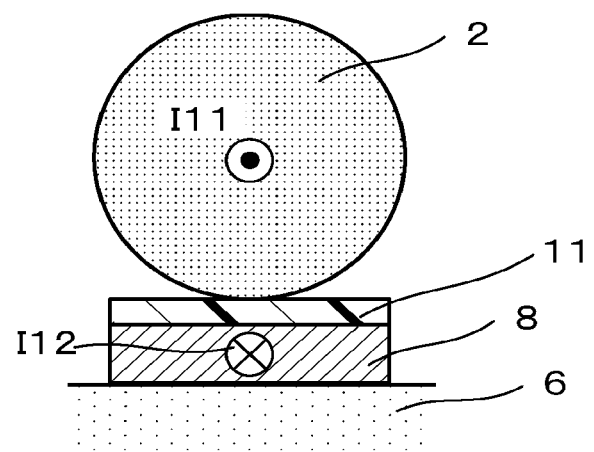
FIG. 21 is a cross-sectional view taken along line XXI-XXI of FIG. 20.

As illustrated in FIGS. 19 to 21, this embodiment is a mode of a magneto-impedance sensor element 10 including a parallel conductor 8.

The MI sensor element 10 of this embodiment includes the magneto-sensitive body 2, the parallel conductor 8, and the detection coil 3. In the magneto-sensitive body 2, electromagnetic properties vary by a magnetic field externally acting thereon. The parallel conductor 8 is a conductor arranged in parallel with the magneto-sensitive body 2. The detection coil 3 is wound around the magneto-sensitive body 2 and the parallel conductor 8.

Similarly to the first embodiment, this embodiment is configured so that a voltage corresponding to an intensity of the magnetic field acting on the magneto-sensitive body 2 is output from the detection coil 3 by applying a pulse current or a high-frequency current to the magneto-sensitive body 2.

And this embodiment is configured so that the parallel conductor 8 carries a pulse current or a high-frequency current in the direction opposite to that of the pulse current or the high-frequency current applied to the magneto-sensitive body 2. In this embodiment, a pulse current is applied to the magneto-sensitive body 2 and the parallel conductor 8.

Also in this embodiment, the magneto-sensitive body 2 is a magneto-sensitive wire and is constituted of an amorphous wire. The parallel conductor 8 is connected in series with the magneto-sensitive body 2. That is, one end 84 of the parallel conductor 8 is electrically connected to one end 24 of the magneto-sensitive body 2.

The parallel conductor 8 is formed on the surface of the substrate 6. The parallel conductor 8 may be formed on the surface of the substrate 6 by, for example, copper plating or the like. As illustrated in FIGS. 20 and 21, the magneto-sensitive body 2 is disposed on a surface of the parallel conductor 8 opposite to the substrate 6 with an insulation layer 11 being interposed therebetween. In this embodiment, the insulation layer 11 made of resin is formed on the surface of the parallel conductor 8. In FIGS. 20 and 21, the detection coil 3 is omitted.

As illustrated in FIGS. 19 and 20, the magneto-sensitive body 2 is mounted on the surface of the parallel conductor 8 with the insulation layer 11 being interposed therebetween such that the longitudinal direction (axial direction) of the magneto-sensitive body 2 and the longitudinal direction of the parallel conductor 8 coincide with each other. In this regard, the one end 24 of the magneto-sensitive body 2 and the one end 84 of the parallel conductor 8 are connected at an end part connection section 12. As illustrated in FIG. 19, an other end 25 of the magneto-sensitive body 2 is electrically connected to a magneto-sensitive body terminal 410 disposed on the substrate 6, and an other end 85 of the parallel conductor 8 is electrically connected to a conductor terminal 420 disposed on the substrate 6. That is, the MI sensor element 10 includes the magneto-sensitive body terminal 410 drawn out from the end part 25 of the magneto-sensitive body 2 on the opposite side of the end part connection section 12, and the conductor terminal 420 drawn out from the end part 85 of the parallel conductor 8 on the opposite side of the end part connection section 12.

Due to this configuration, for example, when a pulse current is applied from the magneto-sensitive body terminal 410, a current I11 applied to the magneto-sensitive body 2 returns at the end part connection section 12, and a current I12 in the opposite direction is applied to the parallel conductor 8 (see FIG. 20). The pulse current can be also applied from the conductor terminal 420. Also in this case, the parallel conductor 8 and the magneto-sensitive body 2 are applied with currents in mutually opposite directions.

It is ideal that the magnitude of the pulse current or the high-frequency current applied to the parallel conductor 8 is equal to the magnitude of the pulse current or the high-frequency current applied to the magneto-sensitive body 2. Therefore, by adjusting, for example, the thickness, etc. of the parallel conductor 8, the electrical resistance of the parallel conductor 8 can be appropriately adjusted.

In this embodiment, the magneto-sensitive body 2 is arranged adjacent to the parallel conductor 8 almost entirely in the longitudinal direction (for example, 90% or more) except for a part of the magneto-sensitive body 2 that is not adjacent to the parallel conductor 8. The part of the magneto-sensitive body 2 that is not adjacent to the parallel conductor 8 corresponds to a part around which the detection coil 3 is not wound.

As illustrated in FIG. 19, the detection coil 3 is wound so as to surround both the magneto-sensitive body 2 and the parallel conductor 8. In the axial direction of the magneto-sensitive body 2, the detection coil 3 includes two coil sections 310 and 320. The two coil sections 310 and 320 are electrically connected to each other by a connection wiring 330 at the end parts on the opposite side in the axial direction of the magneto-sensitive body 2. The two coil sections 310 and 320 are electrically connected to the output terminals 51 and 52, respectively, at end parts close to each other in the axial direction.

The parallel conductor 8 is arranged adjacent to the magneto-sensitive body 2 in one direction orthogonal to the axial direction of the magneto-sensitive body 2. In this embodiment, the magneto-sensitive body 2 and the parallel conductor 8 are arranged adjacent to each other in the normal direction of the substrate 6.

In the MI sensor element 10 of this embodiment, the parallel conductor 8 carries a pulse current or a high-frequency current in the direction opposite to the direction of the pulse current or the high-frequency current applied to the magneto-sensitive body 2. Thus, origin vibration can be reduced similarly to the first embodiment. Hereinafter, the pulse current or the high-frequency current is appropriately referred to as pulse current or the like.

That is, the magnetic field variation caused by the pulse current or the like applied to the magneto-sensitive body 2 can be canceled by the magnetic field variation caused by the pulse current or the like applied to the parallel conductor 8. In a case where there is a difference between the magnitude of the pulse current or the like applied to the parallel conductor 8 and the magnitude of the pulse current or the like applied to the magneto-sensitive body 2, the magnetic field variation described above cannot be completely canceled, but can be curtailed. Therefore, origin vibration can be reduced in the output of the MI sensor element 10.

In the case of this embodiment, origin vibration can be reduced as described above by providing the parallel conductor 8. Therefore, origin vibration can be reduced without hindering downsizing of the MI sensor element 10. That is, in this embodiment, it is not necessary to add or lengthen the magneto-sensitive body 2 in order to reduce the origin vibration.

The parallel conductor 8 can be formed by, for example, a general wiring patterning technique using, photolithography and plating. Therefore, origin vibration can be reduced without complicating the method for manufacturing the MI sensor element 10 in particular.

The parallel conductor 8 is connected in series with the magneto-sensitive body 2. Due to this configuration, the pulse current or the high-frequency current applied to the parallel conductor 8 can be easily synchronized with the pulse current or the high-frequency current applied to the magneto-sensitive body 2. Therefore, reduction of origin vibration can be more easily achieved.

The parallel conductor 8 is arranged adjacent to the magneto-sensitive body 2 in one direction orthogonal to the axial direction of the magneto-sensitive body 2. Due to this configuration, disturbance of the current distribution in the parallel conductor 8 can be curtailed. That is, when the frequency of the applied pulse current or the like increases, the impedance of the insulation layer 11 arranged between the magneto-sensitive body 2 and the parallel conductor 8 easily decreases. Then, assumed that the parallel conductor is arranged adjacent to the entire circumference of the magneto-sensitive body, an influence of the impedance decrease in the insulation layer increases, and the distribution of the current applied to the parallel conductor becomes to be easily disturbed. On the other hand, in a case where the parallel conductor 8 is arranged adjacent only in one direction orthogonal to the axial direction of the magneto-sensitive body 2, an influence of the impedance decrease of the insulation layer 11 can be reduced. As a result, reduction of origin vibration can be more effectively achieved.

Other than the above, the same actions and effects as in the first embodiment are achieved.

As a modification of the seventh embodiment, for example, the magneto-sensitive body 2 and the parallel conductor 8 can be arranged side by side in a direction parallel to the surface of the substrate 6 (not illustrated).

As another modification of the seventh embodiment, the magneto-sensitive body 2 and the parallel conductor 8 can be configured not to be electrically connected to each other (not illustrated). In this case, it is possible to configure such that a pulse current or the like is applied to each of the magneto-sensitive body 2 and the parallel conductor 8 with a method according to the fourth embodiment.

The parallel conductor and the magneto-sensitive body do not necessarily have to be completely parallel, and may be slightly inclined to each other as long as they are substantially parallel.

This invention is not limited to the above embodiments, and can be applied to various embodiments without departing from the gist of the present invention.

The invention claimed is:

1. A magneto-impedance sensor element comprising:
a magneto-sensitive body having electromagnetic properties that vary by a magnetic field externally acting thereon; and
a detection coil wound around the magneto-sensitive body, wherein the magneto-impedance sensor element is configured so that a voltage corresponding to an intensity of the magnetic field acting on the magneto-sensitive body is output from the detection coil by applying a pulse current or a high-frequency current to the magneto-sensitive body, and
the magneto-sensitive body includes a first magneto-sensitive section and a second magneto-sensitive section that are configured to carry the pulse current or the high-frequency current in mutually opposite directions.

2. The magneto-impedance sensor element according to claim 1, wherein the detection coil includes a first coil section wound around the first magneto-sensitive section and a second coil section wound around the second magneto-sensitive section, and the first coil section and the second coil section are electrically connected in series to each other and have a same winding orientation.

3. The magneto-impedance sensor element according to claim 2, wherein the first magneto-sensitive section and the second magneto-sensitive section are integrally formed as one magneto-sensitive wire.

4. The magneto-impedance sensor element according to claim 3 further comprising a substrate on which the magneto-sensitive body and the detection coil are mounted, wherein the substrate is provided with a ground layer that is grounded, and both end parts of the magneto-sensitive body are electrically connected to the ground layer.

5. The magneto-impedance sensor element according to claim 1 further comprising: a first terminal drawn out from one end of the first magneto-sensitive section; and a second terminal drawn out from one end of the second magneto-sensitive section, wherein the first terminal and the second terminal are electrically independent of each other.

6. The magneto-impedance sensor element according to claim 2, further comprising:
a first terminal drawn out from one end of the first magneto-sensitive section; and
a second terminal drawn out from one end of the second magneto-sensitive section,
wherein the first terminal and the second terminal are electrically independent of each other.

7. The magneto-impedance sensor element according to claim 3, further comprising:
a first terminal drawn out from one end of the first magneto-sensitive section; and a second terminal drawn out from one end of the second magneto-sensitive section,
wherein the first terminal and the second terminal are electrically independent of each other.

8. A magneto-impedance sensor element comprising:
a magneto-sensitive body having electromagnetic properties that vary by a magnetic field externally acting thereon;
a parallel conductor arranged in parallel with the magneto-sensitive body; and
a detection coil wound around the magneto-sensitive body and the parallel conductor, wherein
the magneto-impedance sensor element is configured so that a voltage corresponding to an intensity of the magnetic field acting on the magneto-sensitive body is output from the detection coil by applying a pulse current or a high-frequency current to the magneto-sensitive body, and
the parallel conductor carries a pulse current or a high-frequency current in a direction opposite to that of the pulse current or the high-frequency current being applied to the magneto-sensitive body.

9. The magneto-impedance sensor element according to claim 8, wherein the parallel conductor is connected in series with the magneto-sensitive body.

10. The magneto-impedance sensor element according to claim 8, wherein the parallel conductor is arranged adjacent to the magneto-sensitive body in one direction orthogonal to an axial direction of the magneto-sensitive body.

11. The magneto-impedance sensor element according to claim 9, wherein the parallel conductor is arranged adjacent to the magneto-sensitive body in one direction orthogonal to an axial direction of the magneto-sensitive body.

12. A magneto-impedance sensor element comprising:
a magneto-sensitive body having electromagnetic properties that vary by a magnetic field externally acting thereon; and
a detection coil wound around the magneto-sensitive body, wherein the magneto-impedance sensor element is configured so that a voltage corresponding to an intensity of the magnetic field acting on the magneto-sensitive body is output from the detection coil by applying a pulse current or a high-frequency current to the magneto-sensitive body, and
the magneto-sensitive body includes a first magneto-sensitive section and a second magneto-sensitive section that are configured to carry the pulse current or the high-frequency current in mutually opposite directions, wherein the magnetic field acting on the magneto-sensitive body is measured in a direction parallel to the magneto-sensitive wire.

* * * * *